United States Patent [19]
Prentice

[11] Patent Number: 5,896,053
[45] Date of Patent: Apr. 20, 1999

[54] SINGLE ENDED TO DIFFERENTIAL CONVERTER AND 50% DUTY CYCLE SIGNAL GENERATOR AND METHOD

[75] Inventor: John S. Prentice, Palm Bay, Fla.

[73] Assignee: Harris Corporation, Melbourne, Fla.

[21] Appl. No.: 08/873,899

[22] Filed: Jun. 13, 1997

Related U.S. Application Data

[63] Continuation of application No. 08/506,977, Jul. 28, 1995, abandoned.

[51] Int. Cl.$^6$ ........................................ H03K 3/00
[52] U.S. Cl. .................. 327/255; 327/175; 327/238; 327/246
[58] Field of Search ........................ 327/175, 155, 327/158, 159, 231, 233, 236, 238, 239, 243–247, 254, 255

[56] References Cited

U.S. PATENT DOCUMENTS

| | | | |
|---|---|---|---|
| 4,527,075 | 7/1985 | Zbinden | 327/175 |
| 5,281,924 | 1/1994 | Maloberti et al. | 330/253 |
| 5,408,135 | 4/1995 | Choi et al. | 327/257 |
| 5,572,158 | 11/1996 | Lee et al. | 327/175 |

FOREIGN PATENT DOCUMENTS

| 3-201819 | 9/1991 | Japan | 327/175 |
|---|---|---|---|

*Primary Examiner*—Kenneth B. Wells
*Attorney, Agent, or Firm*—Rogers & Killeen

[57] ABSTRACT

A high frequency, current mode, single-ended-to-differential signal converter with low input impedance constant to very high frequencies and a balanced output signal even for large signals. A wide range of input voltages may be accommodated and a d.c. offset correction added. A circuit for achieving a precise fifty percent duty cycle digital signal is disclosed. A circuit for ensuring a 90° phase differential between two signals needed for quadrature multiplication is disclosed. Unusual precision in phase control of the quadrature signals needed for modulation and demodulation of wireless signals is obtained by the use of feedback circuits in both the duty cycle generator and phase shifter.

20 Claims, 2 Drawing Sheets

(50% DUTY CYCLE)

SINGLE ENDED TO DIFFERENTIAL CONVERTER AND 50% DUTY CYCLE SIGNAL GENERATOR AND METHOD

This is a continuation of application Ser. No. 08/506,977, filed Jul. 28, 1995, now abandoned.

BACKGROUND OF THE INVENTION

The present invention relates to the generation of quadrature signals and more particularly to precision controlled signals for use in very high frequency wireless communication systems in the quadrature modulation and demodulation circuits thereof.

A circuit for achieving a precise fifty percent duty cycle digital signal is disclosed in which a differential ground referenced sine wave is level shifted, and then amplified and limited to provide two approximately square waves of equal amplitude but 180° out of phase. The sum of the two waves is a square wave which differs from an average amplitude of zero by the error in duty cycle and used to either modulate the input sine wave or delay one of the two output signals. This circuit may use the converter.

A circuit for ensuring a 90° phase differential between two signals needed for quadrature multiplication is disclosed in which the error in phase differential is filtered and amplified and used to either delay one of the two signals or to adjust the input signal.

The feedback signal from the 90° phase shifter may be used to either modulate the input sine wave or delay one of the two output signals of the 50% duty cycle generator.

Unusual precision in phase control of the quadrature signals needed for modulation and demodulation of wireless signals is obtained by the use of feedback circuits in both the duty cycle generator and phase shifter.

In one aspect, the present invention achieves precision by the use of feedback loops to control both the phase differential between the quadrature signals and the generation of the 50% duty cycle signals used as input signals from which the quadrature signals are generated. The use of feedback loops for control of a 50% duty cycle generator is known (e.g., Zbinden U.S. Pat. No. 4,527,075), as is the use of feedback loops to control the phase difference between two signals (e.g., Fitzsimmons U.S. Pat. No. 5,027,124), but the combination is not. Nor is it known to use a feedback signal from the phase differential circuit to control phase shift by control of the generation of the 50% duty cycle signal generator.

In another aspect, the present invention uses the phase difference error signal as the signal which controls the operation of the 50% duty cycle generator.

Accordingly, it is an object of the present invention to provide a novel quadrature signal generator and method with multiple feedback loops and/or a feedback loop from the output all the way back to the input of the 50% duty cycle generator.

In another aspect of the present invention, it is another object of the present invention to provide a novel method and feedback circuit within the duty cycle generator.

In still another aspect of the present invention, it is an object to provide a novel method and single-ended-to-differential generator.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
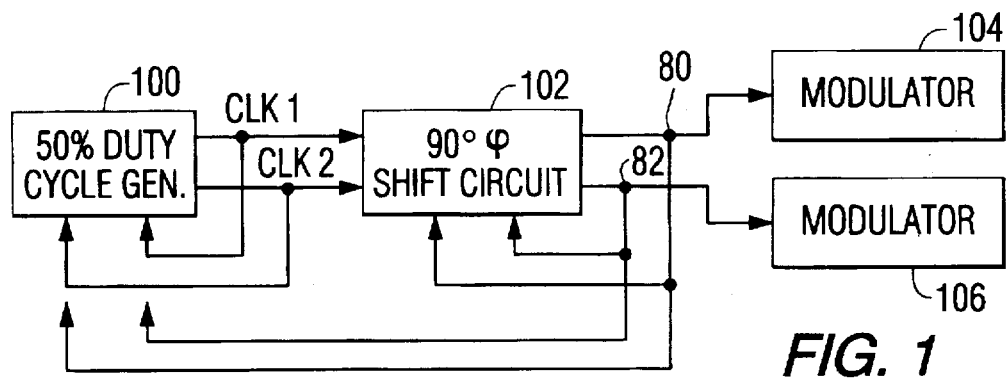
FIG. 1 is a functional block diagram of a portion of the circuit of the present invention for providing quadrature modulation/demodulation signals.

The present invention finds great utility in the quadrature modulating and demodulating of RF and IF signals in wireless communication systems. With reference to FIG. 1, RF modulators/demodulators have a requirement for a precisely controlled fifty percent duty cycle clock signal used to drive a circuit which insures a precise 90° phase shift between the two signals applied to the two modulating/demodulating circuits which process the RF or IF signals in the wireless communication system.

As shown in FIG. 1, a 50% duty cycle generator 100 is operative from a single ground referenced source to generate two clock signals of the same frequency but 180° out of phase. The two clock signals from the generator 100 are applied to a 90° digital phase shifter 102 to provide two signals precisely 90° out of phase (i.e., one-half that of the input signal) for use in the conventional modulators 104 and 106 of the wireless communication system.

Note that the 50% duty cycle signal generator 100 employs a feedback loop to control the duty cycle and that the 90° phase shifter 102 also employs a feedback loop to control the phase shift. The precision of the quadrature signals needed for modulation and demodulation in wireless communications systems is greatly enhanced by the use of both of these feedback loops.

Alternatively, the feedback loop from the 90° phase shifter 102 may be applied directly to the 50% duty cycle generator to correct the cumulative duty cycle and phase error by the adjustment of the duty cycle generator.

Figure 2:
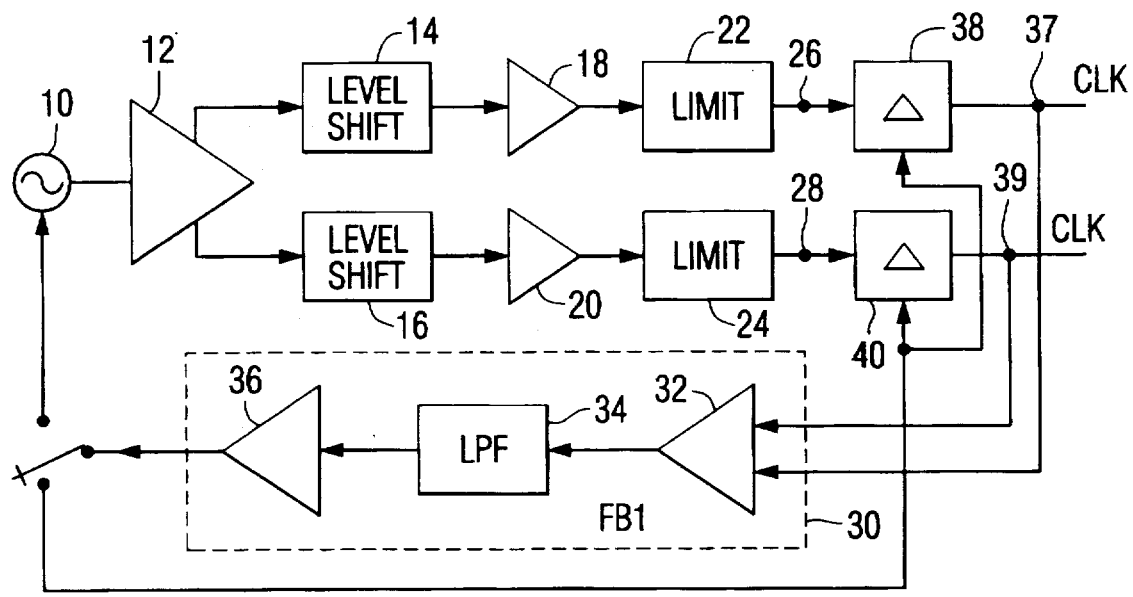
FIG. 2 is one embodiment of the novel 50% duty cycle generator of FIG. 1.

With reference to the 50% duty cycle generator of FIG. 1 illustrated in greater detail in FIG. 2, a ground referenced sine wave from any suitable conventional source 10 may be applied to a suitable conventional multistage amplifier 12 for conversion into a differential signal, i.e., two signals 180° out of phase. These two signals may be level shifted in level shifters 14 and 16, amplified in amplifiers 18 and 20 and limited in limiters 22 and 24 to provide two output signals on the terminals 26 and 28 which, being derived from the same signal, have the same frequency. With appropriate selection of the levels, these signals will approximate square waves. Each of the level shifters, amplifiers and limiters may be any suitable conventional circuit for performing such function.

In a perfect world, the algebraic sum of these out-of-phase signals on the terminals 26 and 28 will be a square wave whose amplitude is zero, i.e., there should be no difference in the amplitudes of the two out-of-phase signals. Equal positive and negative amplitudes are readily realizable with integrated circuits.

However, there are circuit imbalances inherent in single ended to differential signal conversion and in amplifier offset voltage. Such imbalances result in duty cycle variations. In addition, the presence of even order harmonics in the input signal degrade the duty cycle.

The present invention includes a feedback loop 30 by which the signals on the output terminals 37 and 39 effect correction of the duty cycle. The two signals are applied to a differential amplifier 32 and the output signal therefrom is applied through a low pass filter 34 and amplifier 36 as the feedback signal. The amplifiers 32 and 36 and the filter 34 may be any suitable conventional circuits for performing these functions. The average value of the feedback or error signal will be zero for a fifty percent duty cycle signal, and the amplitude of the signal is proportional to the departure of the duty cycle from fifty percent.

In the embodiment illustrated by the upper position of the switch in FIG. 2, the error signal from the amplifier 36 is applied to the input sine wave generator 10 to change the zero crossings thereof and thereby modulate the sine wave. In the preferred embodiment, the amplifier 36 is a transconductance amplifier and the frequency setting sine wave is converted to a current to facilitate the modulation thereof.

Note that this adjustment is not effective where the input wave form has a vertical wave front, for without a horizontal component in the input signal a vertical shift of the threshold would not horizontally change the crossing point.

An alternative shown in the lower position of the switch in FIG. 1 applies the error signal to a delay or pulse width modulation circuit 38 and/or 40 to bring the two signals into the desired fifty percent duty cycle relationship. The delay circuits 38 and 40 may be any suitable conventional circuits including adjustable timing elements, e.g., voltage controlled circuit elements such as capacitors or reverse biased diodes.

Note that the known prior art, e.g., the 1982 Zbinden U.S. Pat. No. 4,527,075, employs a feedback path which includes a series connected buffer or differential amplifier, low pass filter and a second differential or operational amplifier, whereas the feedback path of the 50% duty cycle generator of the present invention uses only one differential amplifier 32 before the low pass filter 34 and the amplifier 36 is not a differential amplifier, i.e., the filtering is accomplished in the present invention after the differential signals are combined, and only one differential amplifier is required.

Figure 3:
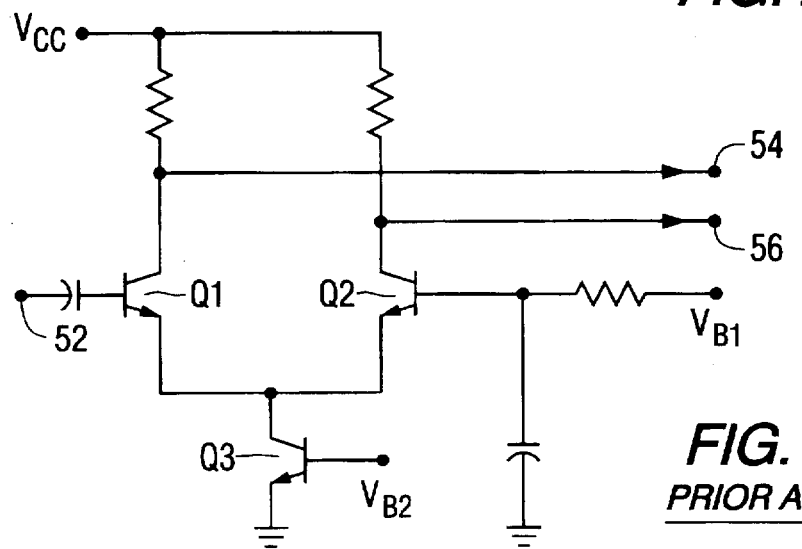
FIG. 3 is a schematic circuit diagram of a prior art single-ended-to-differential circuit which may be used in the generator of FIG. 2.

With reference to the differential amplifier 12 of FIG. 2, a known amplifier is illustrated in FIG. 3. As shown in FIG. 3, the ground referenced input signal from the source 10 of FIG. 2 is applied from a terminal 52 through a coupling capacitor to the base of NPN transistor Q1 and is converted to a differential current at the collectors of the transistors Q1 and Q2, which provide the two output signals on the output terminals 54 and 56.

A balanced differential current results in the converter of FIG. 3 when equal voltages are applied to the base-emitter junctions of transistors Q1 and Q2. Since the base of transistor Q2 is a.c. grounded, the one half of the input voltage is applied to the emitter of the transistor Q2 and the current source represented by the transistor Q3. At the high frequencies at which wireless communication systems must operate, the conductance of the current source is significant, thus reducing the value of the current at the collector of the transistor Q2 and creating a significant imbalance in the duty cycle. In addition, further imbalance results from the current flowing through the collector-base capacitances, i.e., the larger voltage on the base of the transistor Q1 results in greater current to the collector and hence the output terminals 54 and 56.

A further disadvantage of such known differential converters is the input impedance which varies with frequency and thus presents additional design constraints where the circuit is required to operate over a large frequency range.

Figure 4:
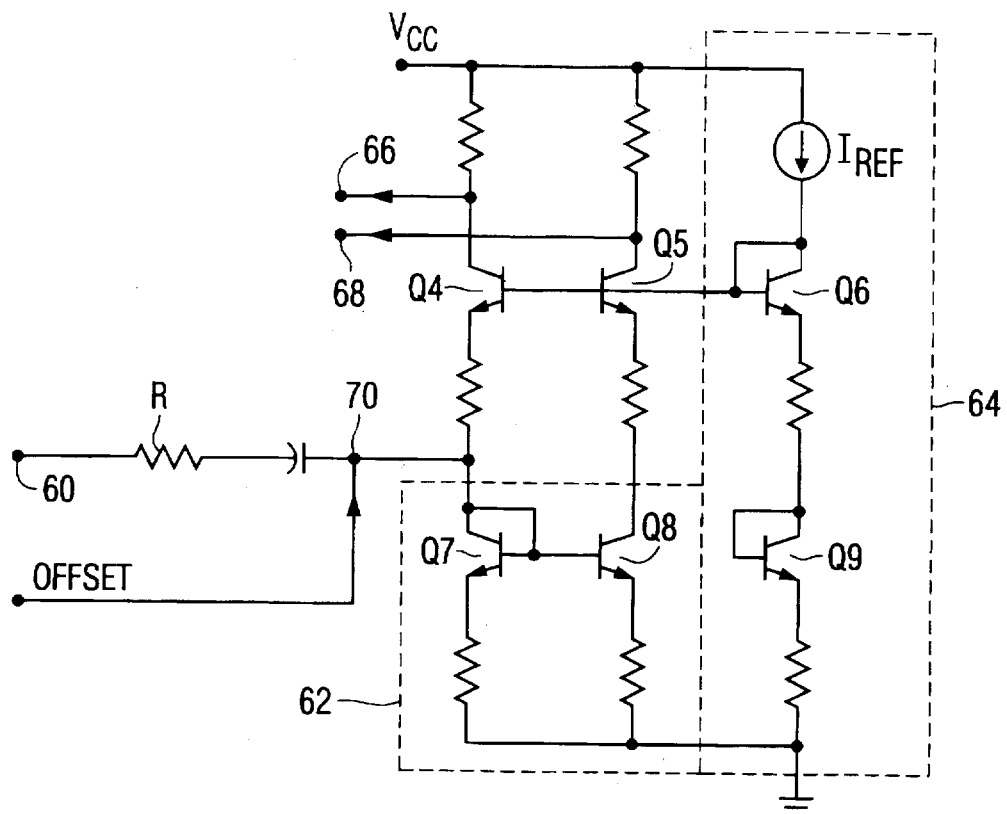
FIG. 4 is a schematic circuit diagram of one embodiment of the novel generator of the present invention.

In contrast to the known converters illustrated in FIG. 3, the converter illustrated in FIG. 4 receives the input signal from the source 10 of FIG. 2 on terminal 60. This signal is applied to a 1:1 current mirror 62 comprising NPN transistors Q7 and Q8. A biasing circuit 64 including NPN transistors Q6 and Q9 provides biasing for the current mirror 62 and the two NPN transistors Q4 and Q5 so that the four transistors Q4, Q5, Q6 and Q7 have the same nominal operating current $I_{REF}$.

Since the impedance path of the transistors Q4 and Q7 is the same for currents less than $I_{REF}$, one half of the current passes through the transistor Q4 to the output terminal 66. The other half is mirrored through the circuit 62 which introduces a 180° phase shift before passing through the transistor Q5 to the output terminal 68.

The transistors Q4 and Q5 are common base transistors which isolate the transistor Q4 from any output voltage variations and force the transistor Q4 to the same operating point as that of the transistor Q7. Because both common base transistors and current mirrors operate well at frequencies approaching the Ft of the transistors, the transistors operate extremely well at the very high frequencies common in wireless communications systems, e.g., 300 MHz, typically 500 MHz, and up to and including 1 GHz to 10 GHz.

In the event that the input signal is positive and exceeds $I_{REF}$, the transistor Q4 will be cut off and the output signal through the transistor Q5 will be $I_{REF}$ plus the input signal. For a negative input signal which exceeds $I_{REF}$, the transistors Q5, Q7 and Q8 are turned off and the output signal through the transistor Q4 will be $I_{REF}$ plus the input signal. Thus the output signal remains balanced even for very large signals exceeding the reference current $I_{REF}$.

The input impedance of the circuit of FIG. 4 is very low, about that of two parallel diodes for small values of the emitter resistors, and is constant out to very high frequencies.

The only collector-base asymmetry is at the transistor Q8, but the voltage level is small thus producing very little collector-base capacitance current and thus very little output signal imbalance.

If the input signal is a voltage rather than a current, it will be converted to a current by the series resistor R. This is a significant advantage because it permits the adaptation of the circuit to a wide range of input voltages by varying the value of the input resistor R.

A further advantage is the simplicity of the addition of a d.c. offset voltage correction. Since the input signal to the collector of the transistor Q7 is a current, a d.c. current may be added at the node 70. This offset current may be the feedback signal for the 50% duty cycle generator 100 illustrated in FIG. 1.

Figure 5:
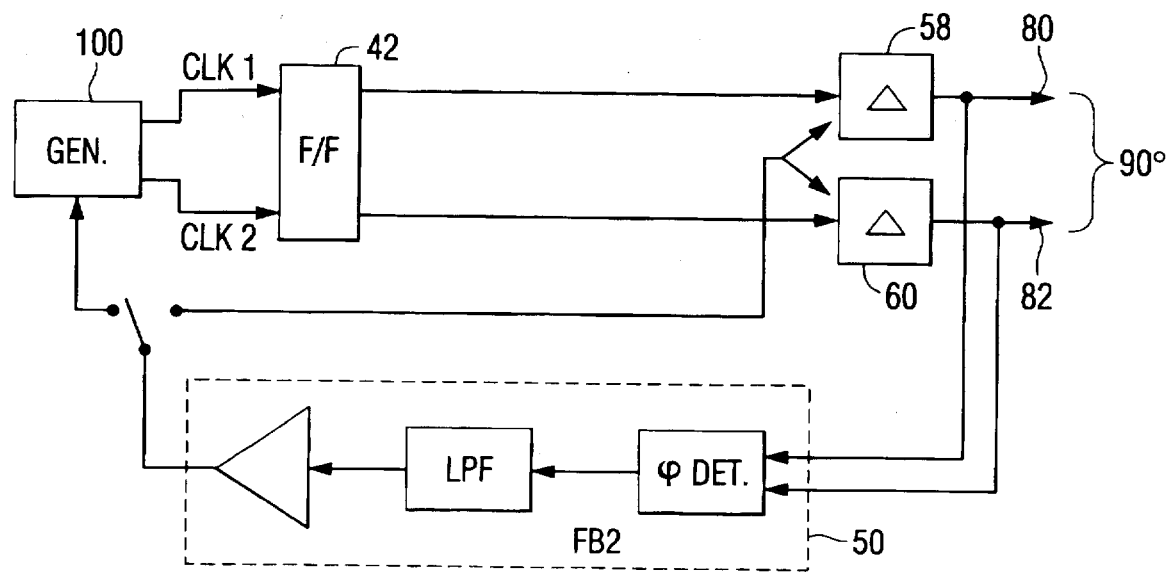
FIG. 5 is a functional block diagram of one embodiment of the novel phase shifter of FIG. 1.

As shown in FIG. 5, the 50% duty cycle generator 100 supplies two input clock signals CLK1 and CLK2 to trigger a conventional bistable circuit or flip-flop 42 to provide two quadrature output signals on the output terminals 80 and 82 which are 90° apart in phase. The divide-by-2 or single stage is less precise than a divide-by-4 or dual stage circuit but requires a less complex and expensive circuit since the frequency of the clock input need be only twice as high as CLK1 and CLK2. There is also less logic error, but there is an additional error if the clock input signals CLK1 and CLK2 do not have a 50% duty cycle.

However, the flip-flop 42 may have multiple stages with the 90° shift provided by taking the output signals from different stages. The divide-by-4 or dual stage circuit is more accurate but may limit the frequency of the CLK1 and CLK2 output signals. In a divide-by-4 circuit, the errors in phase are primarily due to mismatches in gate delays in the logic which makes up the flip-flop stages.

As shown in FIG. 1, the two output signals from the phase shift circuit 102 may be fed back to the input of the phase shift circuit 102 or alternatively to the duty cycle generator 100 illustrated in FIG. 1.

As illustrated in FIG. 5, the feedback path may include a phase detector 52 and the output signal therefrom is applied through a low pass filter 54 and amplifier 56 as the feedback signal. The phase detector may be any suitable high quality detector such as analog multipliers, exclusive OR gates or other mixer circuits. The amplifier 56 and the filter 54 may be any suitable conventional circuits for performing these functions.

The average value of the feedback or error signal will be zero for a phase difference of 90°, and the amplitude of the signal is proportional to the departure of the duty cycle from that desired phase relationship.

This error, in the embodiment illustrated via the left switch terminal in FIG. 5, is applied to the modulate the 50% duty cycle generator 100 for the divide-by-2 implementation.

Alternatively as illustrated in the embodiment illustrated via the right hand switch terminal in FIG. 5, the error signal is applied to a delay circuit 58 and/or 60 to bring the two signals into the desired phase relationship. The delay circuits 58 and 60 may be any suitable conventional circuits including adjustable timing elements, e.g., voltage controlled circuit elements such as capacitors or reverse biased diodes.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A quadrature signal generator suitable for use in a wireless communication system and operable at a frequency of at least 300 MHz comprising:

a 50% duty cycle signal generator having a feedback loop for precise control of the duty cycle of two complementary signals; and a phase shifter circuit, operatively connected to receive the two complementary signals from said 50% duty cycle signal generator, having a feedback loop for precise differential phase control.

2. The generator of claim 1 wherein said 50% duty cycle signal generator includes a current mode, single-ended-to-differential converter.

3. The generator of claim 2 wherein the two output signals from said 50% duty cycle signal generator are balanced for received signals having an amplitude which exceeds the reference current of said current mode, single-ended-to-differential converter.

4. The generator of claim 1 wherein said 50% duty cycle generator includes:

means for providing a sine wave at a desired frequency;
   means for converting the sine wave into two approximately square wave output signals of equal magnitude approximately 180° out of phase;
   means for combining the two output signals;
   means for filtering the combined signals;
   means for amplifying the filtered signal to provide an error signal; and
   means for modifying the duty cycle of at least one of the two output signals responsively to the error signal.

5. The generator of claim 4 wherein said means for modifying the duty cycle includes means for selectively delaying or pulse width modulating one of the two output signals.

6. The generator of claim 4 wherein said means for modifying the duty cycle includes means for modulating the zero crossing of the sine wave.

7. A method of increasing the precision of quadrature signals for use in a wireless communication system operable at a frequency of at least 300 MHz comprising the steps of:

(a) providing two complementary signals responsively to a single input signal;
   (b) phase shifting the two complementary signals to provide quadrature output signals;
   (c) detecting any departure from a 50% duty cycle in the two complementary signals as a first error signal;
   (d) using the first error signal to modify the duty cycle of the two complementary signals;
   (e) detecting any departure from a 90° phase differential in the quadrature output signals as a second error signal;
   (f) using the second error signal to modify the phase differential of the quadrature output signals,
   the correction of the duty cycle of the single input signal from which the quadrature output signals are derived increasing the precision of the quadrature output signals.

8. The method of claim 7 wherein the step of providing two complementary signals includes the step of converting a single input current signal to two complementary current signals of one-half amplitude of the input current signal.

9. The method of claim 8 wherein the conversion utilizes a reference current; and including the step of balancing the complementary signals for input current signals exceeding the reference current used in the conversion.

10. The method of claim 7 wherein the steps of providing two complementary signals responsively to a single input signal and of modifying the duty cycle of the two complementary signals include the steps of:

providing a sine wave at a desired frequency;
    converting the sine wave into two approximately square wave output signals of equal magnitude approximately 180° out of phase to thereby provide the two complementary signals;
    combining the two output signals;
    filtering the combined signals;
    amplifying the filtered signal to provide the first error signal; and
    modifying the duty cycle of at least one of the two output signal responsively to the first error signal.

11. The method of claim 10 wherein the step of modifying the duty cycle includes the selective delaying or pulse width modulating of one of the two complementary signals.

12. The method of claim 10 wherein the step of modifying the duty cycle includes modulating the zero crossing of the sine wave.

13. The method of claim 7 wherein the step of providing two complementary signals responsively to a single input signal comprises the steps of:

providing a pair of common base output transistors;
providing a source of bias current;
mirroring the bias current through one of the output transistors through a first transistor;
applying an input current signal to the emitter of said one output transistor and to the base of the first transistor;
mirroring the current through the first transistor into a second transistor in series with the other one of the output transistors; and
taking the output current from the collector of the two output transistors,
whereby one-half of an input current signal passes through each of said two output transistors to one of said output terminals with a 180° phase shift therebetween.

14. The method of claim 13 including the selective combining an additional input current signal with any input current signal to thereby selectively adjust the zero crossing point of the current signal passing through the output transistors and thus the duty cycle thereof.

15. A method of increasing the precision of quadrature signals for use in a wireless communication system operable at a frequency of at least 300 MHz comprising the steps of:
(a) providing two complementary signals responsively to a single input signal;
(b) phase shifting the two complementary signals to provide quadrature output signals;
(c) detecting any departure from a 90° phase differential in the quadrature output signals as a first error signal; and
(d) using the first error signal to modify the duty cycle of the complementary signals,
the correction of the duty cycle of the complementary signals from which the quadrature signals are derived increasing the precision of the quadrature signals.

16. The method of claim 15 wherein the step of providing two complementary signals responsively to a single input signal comprises the steps of:
providing a pair of common base output transistors;
providing a source of bias current;
mirroring the bias current through one of the output transistors through a first transistor;
applying an input current signal to the emitter of said one output transistor and to the base of the first transistor;
mirroring the current through the first transistor into a second transistor in series with the other one of the output transistors; and
taking the output current from the collector of the two output transistors,
whereby one-half of an input current signal passes through each of said two output transistors to one of said output terminals with a 180° phase shift therebetween.

17. A quadrature signal generator for use in a wireless communication system operable at a frequency of at least 300 MHz comprising:
a 50% duty cycle signal generator having a feedback loop for precise control of the duty cycle of two complementary signals wherein said 50% duty cycle signal generator includes a single ended to differential current converter comprising:
a pair of common base output transistors;
a pair of current mirror transistors;
a source of bias current including a source of reference current and two diodes connected in series;
means for mirroring the bias current through said diodes to one of said output transistors and one of said current mirror transistors;
means for mirroring the bias current through the other one of said output transistors and the other one of said current mirror transistors;
an input circuit adapted to apply an input current signal to the emitter of said one output transistor and to the base of said one current mirror transistor; and
an output terminal connected to the collector of each of said output transistors,
whereby one-half of an input current signal passes through each of said two output transistors to one of said output terminals with a 180° phase shift therebetween; and
a phase shifter circuit operatively connected to receive the two complementary signals from said 50% duty cycle signal generator having a feedback loop for precise differential phase control.

18. The quadrature signal generator of claim 17 including means for selectively combining an additional input current signal with any input current signal to thereby selectively adjust the zero crossing point of the current signal passing through said pair of output transistors to said output terminals and thus the duty cycle thereof.

19. A 50% duty cycle signal generator including a single-ended-to-differential converter with two output signals and a feedback path which includes an amplifier, summing means and a low pass filter and which amplifies the low pass filtered sum of the two output signals therefrom as an error signal for controlling the duty cycle, wherein said 50% duty cycle signal generator includes a single ended to differential current converter comprising:
a pair of common base output transistors;
a pair of current mirror transistors;
a source of bias current including a source of reference current and two diodes connected in series;
means for mirroring the bias current through said diodes to one of said output transistors and one of said current mirror transistors;
means for mirroring the bias current through the other one of said output transistors and the other one of said current mirror transistors;
an input circuit adapted to apply an input current signal to the emitter of said one output transistor and to the base of said one current mirror transistor; and
an output terminal connected to the collector of each of said output transistors,
whereby one-half of an input current signal passes through each of said two output transistors to one of said output terminals with a 180° phase shift therebetween.

20. A quadrature signal generator for use in a wireless communication system operable at a frequency of at least 300 MHz comprising:
a 50% duty cycle signal generator having a feedback loop for precise control of the duty cycle of two complementary signals wherein said 50% duty cycle signal generator includes a single ended to differential current converter; and
a phase shifter circuit operatively connected to receive the two complementary signals from said 50% duty cycle signal generator having a feedback loop for precise differential phase control.

* * * * *